United States Patent
Banerjee et al.

(10) Patent No.: US 8,378,333 B2
(45) Date of Patent: Feb. 19, 2013

(54) LATERAL TWO-TERMINAL NANOTUBE DEVICES AND METHOD FOR THEIR FORMATION

(75) Inventors: Parag Banerjee, Greenbelt, MD (US); Sang Bok Lee, Clarksville, MD (US); Israel Perez, Bethesda, MD (US); Erin Robertson, College Park, MD (US); Gary W. Rubloff, Clarksville, MD (US)

(73) Assignee: University of Maryland, College Park, MD (US)

( * ) Notice: Subject to any disclaimer, the term of this patent is extended or adjusted under 35 U.S.C. 154(b) by 624 days.

(21) Appl. No.: 12/285,005

(22) Filed: Sep. 26, 2008

(65) Prior Publication Data

US 2009/0108252 A1    Apr. 30, 2009

Related U.S. Application Data

(60) Provisional application No. 60/975,634, filed on Sep. 27, 2007.

(51) Int. Cl.
*H01L 29/06* (2006.01)
*H01L 21/20* (2006.01)

(52) U.S. Cl. .......... 257/14; 977/781; 977/828; 977/938
(58) Field of Classification Search ............... 257/14; 977/781, 825, 938
See application file for complete search history.

(56) References Cited

U.S. PATENT DOCUMENTS

| | | | |
|---|---|---|---|
| 5,866,444 A | 2/1999 | Yamazaki et al. | |
| 6,461,528 B1* | 10/2002 | Scherer et al. | 216/56 |
| 6,891,191 B2* | 5/2005 | Xiao et al. | 257/40 |
| 7,045,205 B1* | 5/2006 | Sager | 428/304.4 |
| 7,576,410 B2* | 8/2009 | Rueb et al. | 257/577 |
| 2001/0023986 A1* | 9/2001 | Mancevski | 257/741 |
| 2005/0032297 A1* | 2/2005 | Kamins | 438/232 |
| 2005/0121068 A1* | 6/2005 | Sager et al. | 136/252 |
| 2005/0161662 A1 | 7/2005 | Majumdar et al. | |
| 2005/0274992 A1* | 12/2005 | Appenzeller et al. | 257/288 |
| 2007/0134555 A1 | 6/2007 | Ren et al. | |
| 2007/0275487 A1* | 11/2007 | Lee | 438/22 |
| 2008/0179590 A1* | 7/2008 | Mancevski | 257/40 |
| 2008/0277646 A1* | 11/2008 | Kim et al. | 257/14 |
| 2010/0304204 A1* | 12/2010 | Routkevitch et al. | 429/122 |
| 2010/0314682 A1* | 12/2010 | Yilmaz et al. | 257/328 |

OTHER PUBLICATIONS

Zhang, et al.; "Fabrication of a One-Dimensional Array of Nanopores Horizontally Aligned on a Si Substrate"; Dec. 5, 2008; vol. 5 pp. 1745-1748.

Lu, et al.; "Well-aligned Heterojunctions of Carbon Nanotubhes and Silicon Nanowires Synthesized by Chemical Vapor Deposition"; Apr. 3, 2003; pp. 1107-1109.

(Continued)

*Primary Examiner* — Wai Sing Louie
*Assistant Examiner* — Robert Carpenter
(74) *Attorney, Agent, or Firm* — Squire Sanders (US) LLP

(57) ABSTRACT

An apparatus, system, and method are provided for a lateral two-terminal nanotube device configured to capture and generate energy, to store electrical energy, and to integrate these functions with power management circuitry. The lateral nanotube device can include a substrate, an anodic oxide material disposed on the substrate, and a column disposed in the anodic oxide material extending from one distal end of the anodic oxide material to another end of the anodic oxide material. The lateral nanotube device further can include a first material disposed within the column, and a second material disposed within the column. The first material fills a distal end of the column and gradiently decreases towards another distal end of the column along inner walls of the column. The second material fills the another distal end of the column and gradiently decreases towards the distal end of the column within the first material.

28 Claims, 13 Drawing Sheets

OTHER PUBLICATIONS

International Search Report, PCT/US 08/11221, dated Jan. 6, 2009.
Hideki Masuda and Kenji Fukuda, "Ordered Metal Nanohole Arrays Made by a Two-Step Replication of Honeycomb Structures of Anodic Alumina," Science, vol. 268, Jun. 9, 1995, pp. 1466-1468.
Michael Grätzel, "Mesoporous Oxide Junctions and Nanostructured Solar Cells," Current Opinion in Colloid & Interface Science, 4, 1999, pp. 314-321.
K.M.P. Bandaranayake, et al., "Dye-sensitized Solar Cells Made from Nanocrystalline TiO2 Films Coated with Outer Layers of Different Oxide Materials," Coordination Chemistry Reviews, 248, 2004, pp. 1277-1281.
Christoph J. Brabec, "Organic Photovoltaics: Technology and Market," Solar Energy Materials & Solar Cells, 83, 2004, pp. 273-292.
B.M. Kayes and H.A. Atwater, "Comparison of the Device Physics Principles of Planar and Radial *p-n* Junction Nanorod Solar Cells," Journal of Applied Physics, 97, 114302, 2005, pp. 1-11.
T. Gougousi, et al., "Metal Oxide Thin Films Deposited from Metal Organic Precursors in Supercritical CO2 Solutions," American Chemical Society, 17, 2005, pp. 5093-5100.
Zhi Chen and Hongguo Zhang, "Mechanisms for Formation of a One-Dimensional Horizontal Anodic Aluminum Oxide Nanopore Array on a Si Substrate," Journal of The Electrochemical Society, 152 (12), 2005, pp. D227-D231.
S.E. Gledhill, et al., "Organic and Nano-Structured Composite Photovoltaics: An Overview," Journal of Materials Research, vol. 20, No. 12, Dec. 2005, pp. 3167-3179.
D. Barua, et al., "Supercritical-carbon Dioxide-assisted Cyclic Deposition of Metal Oxide and Metal Thin Films," American Institute of Physics, Applied Physics Letters, 88, 2006, pp. 1-3.
H. Zhang, et al., "A Horizontally Aligned One-Dimensional Carbon Nanotube Array on a Si Substrate," Journal of the Electrochemical Society, 154 (2), 2007, pp. H124-H126.
I. Perez, et al., "TEM-Based Metrology for HfO2 Layers and Nanotubes Formed in Anodic Aluminum Oxide Nanopore Structures," Metrology for HfO2 Layers and Nanotubes, Small, 4, No. 8, 2008, pp. 1223-1232.

\* cited by examiner

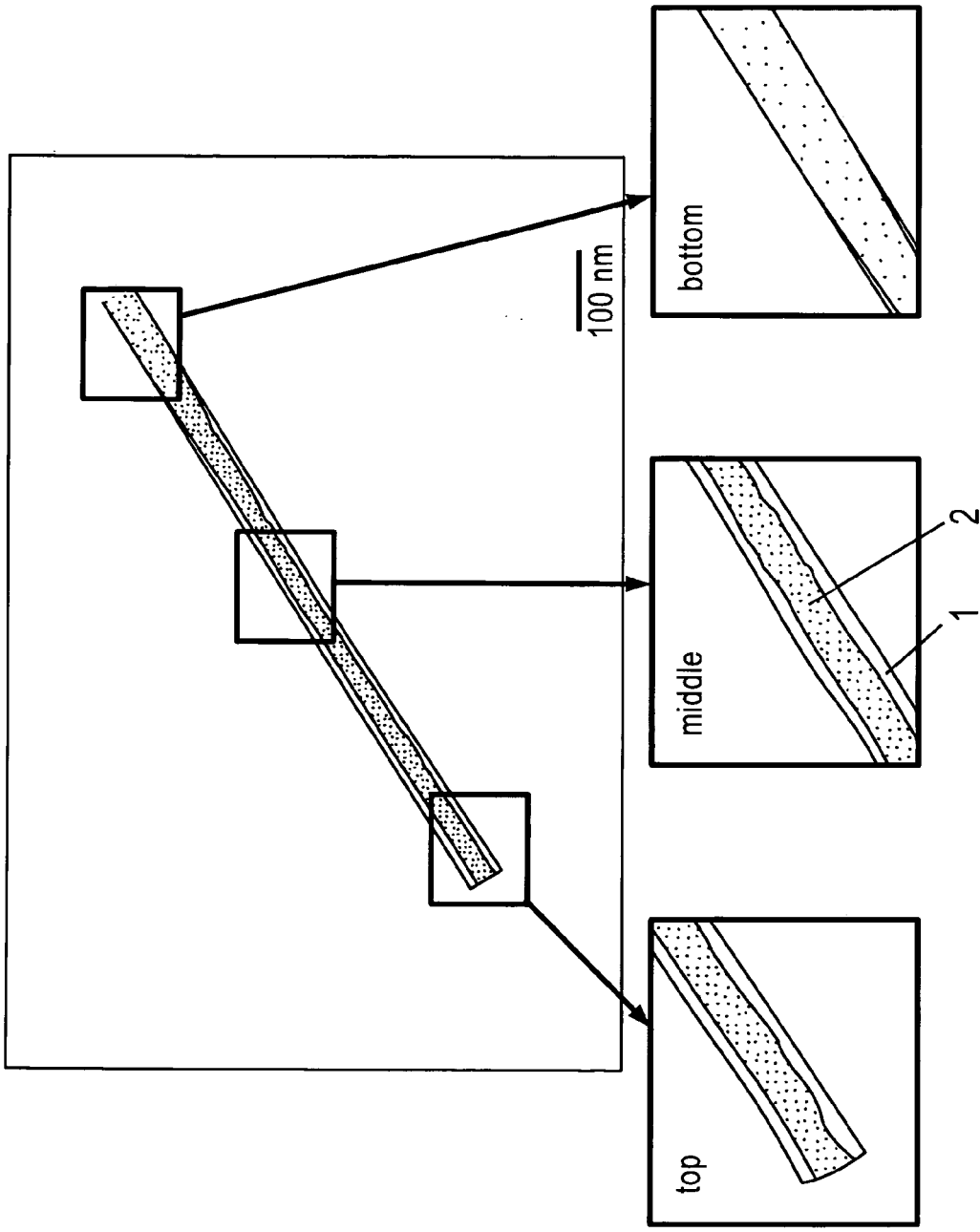

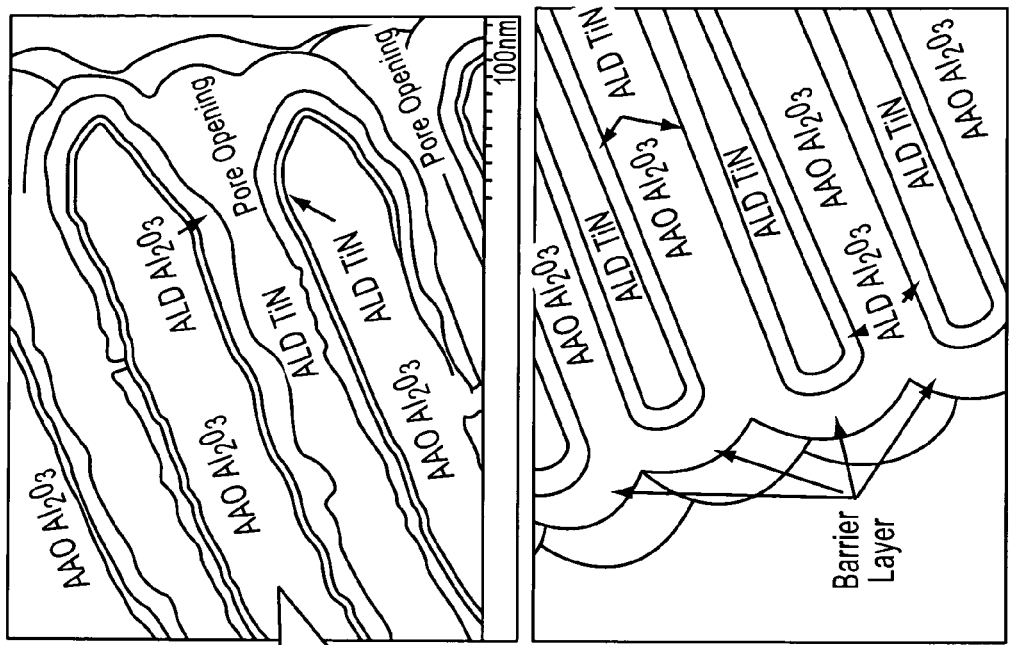
Fig.4b Prior Art
Fig.4c Prior Art
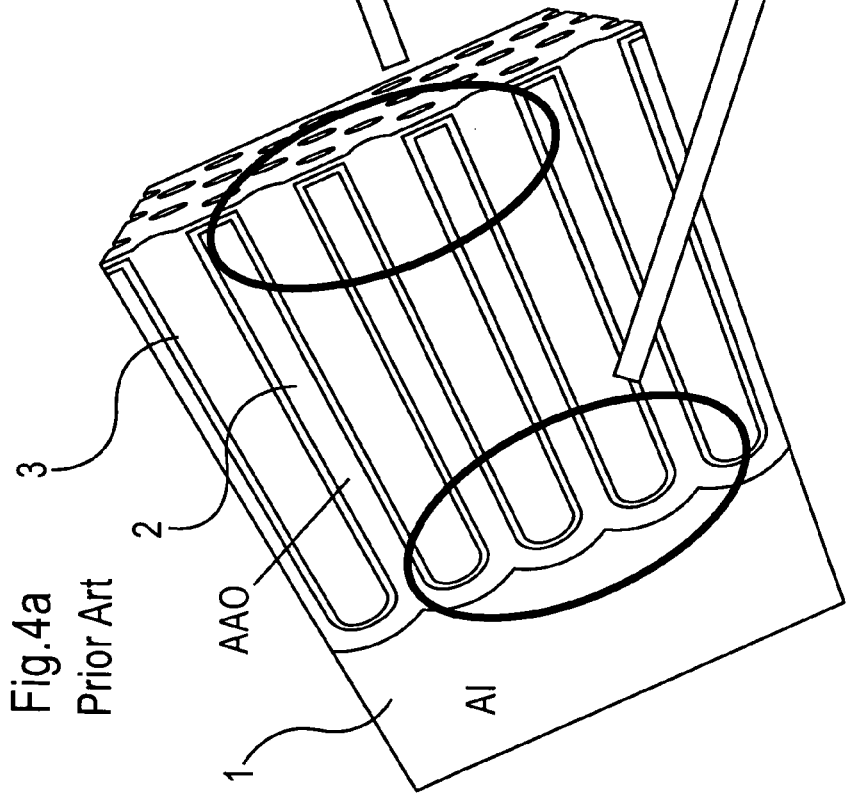
Fig.4a Prior Art

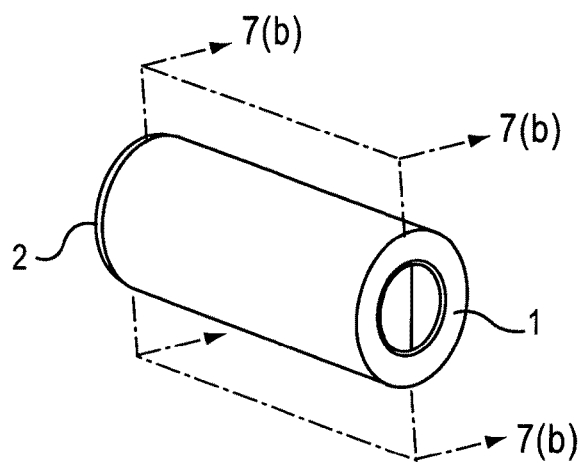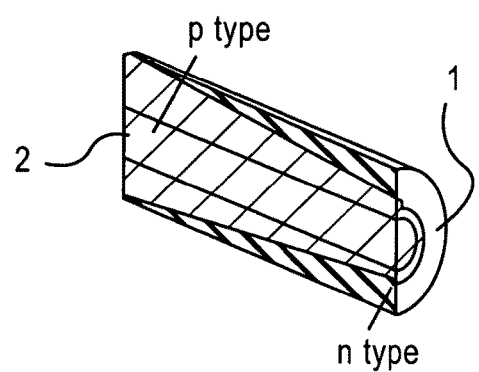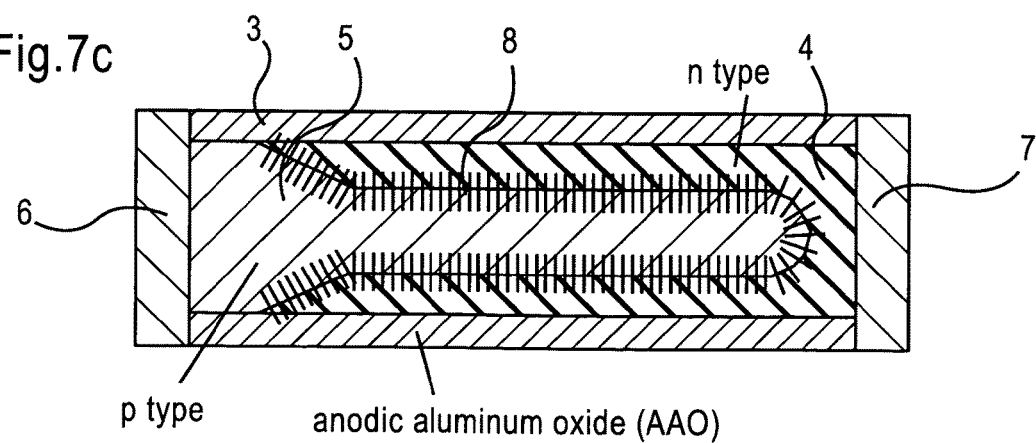

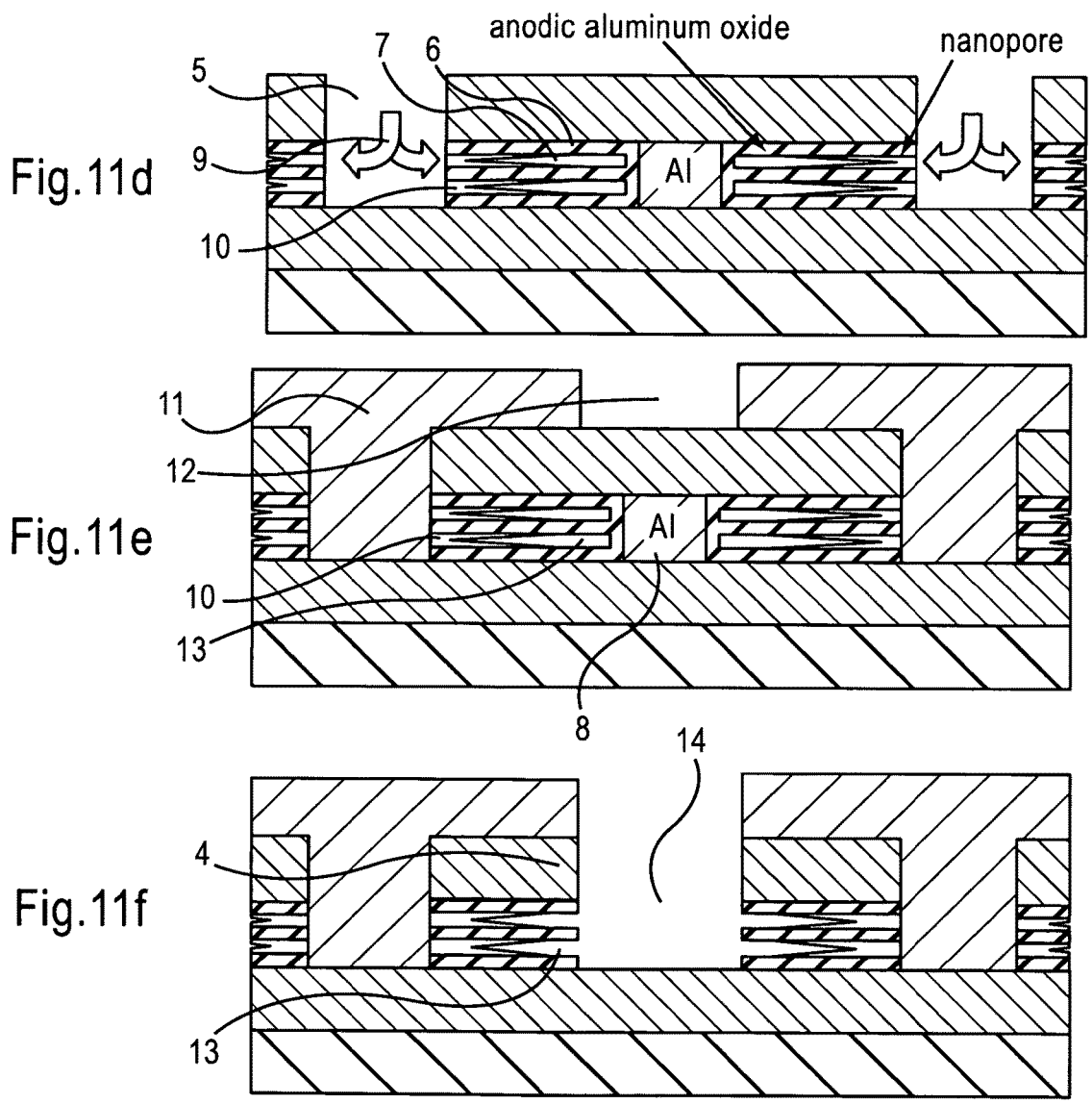

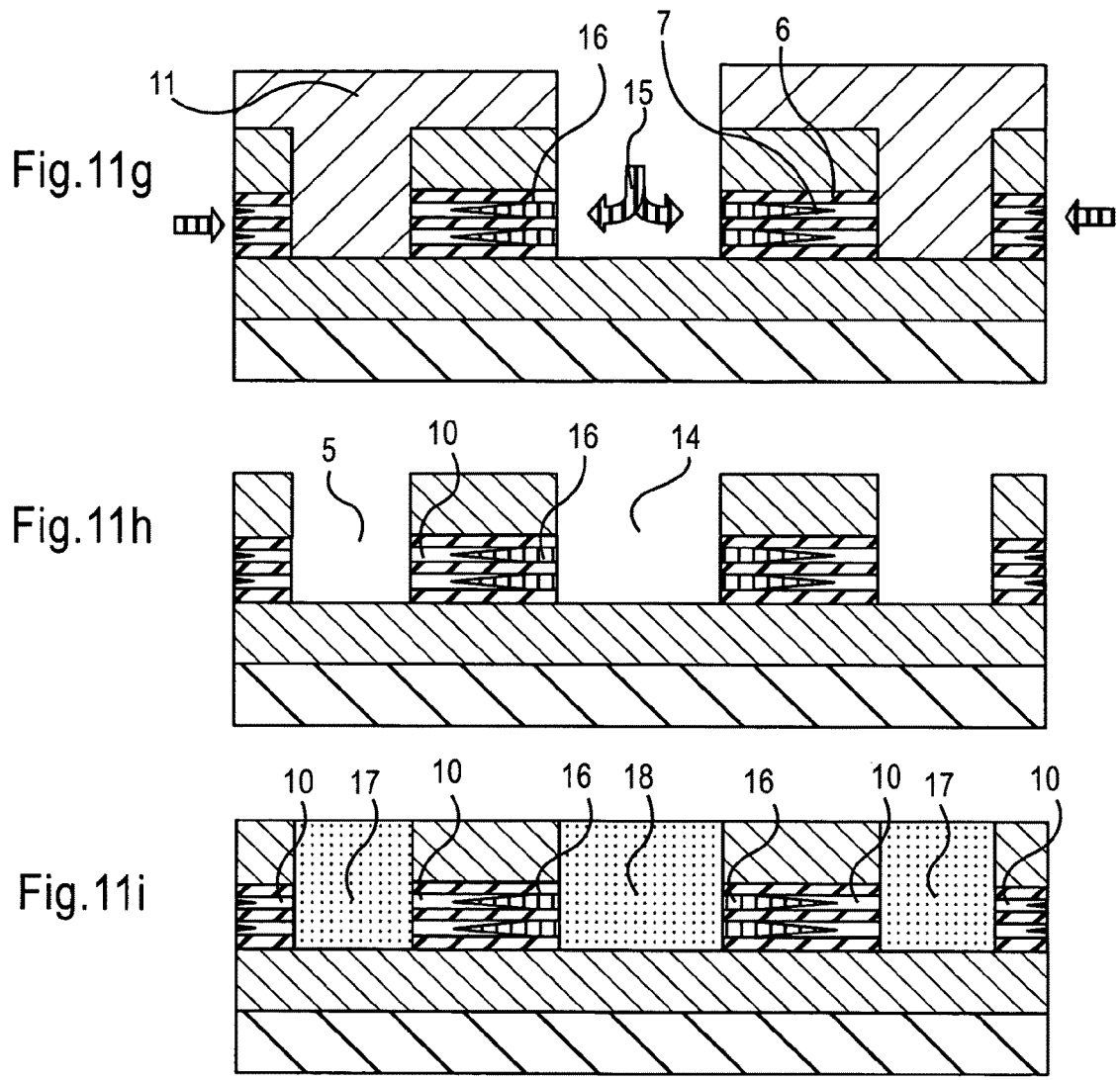

LATERAL TWO-TERMINAL NANOTUBE DEVICES AND METHOD FOR THEIR FORMATION

CROSS REFERENCE TO RELATED APPLICATIONS

This application claims priority under 35 U.S.C. §119(e) of U.S. Provisional Patent Application Ser. No. 60/975,634, filed on Sep. 27, 2007. The subject matter of the earlier filed application is hereby incorporated by reference.

This invention was made with United States Government support under Contract No. H9823004C0448 awarded by the National Security Agency and under Contract No. DMR0520471 awarded by the National Science Foundation. The United States Government has certain rights in this invention.

BACKGROUND OF THE INVENTION

1. Field of the Invention

The present invention relates to an apparatus, system, and method for lateral two-terminal nanotube devices. More particularly, the present invention relates to an apparatus, system, and method for providing lateral two-terminal nanotube devices configured to capture and generate energy, to store electrical energy, and to integrate these functions with power management circuitry.

2. Description of the Related Art

The limitations of conventional devices for energy capture and storage are well known. In semiconductor p-n junction solar cells, planar device layers typically create only a single depletion layer over the surface to separate photo-induced carriers. As a result, each substrate of a semiconductor p-n junction solar cell can be limited to only a single active layer. Furthermore, some of the semiconductor material can absorb light, producing excitations outside a depletion range. This can prevent the separation of positive and negative charges and the collection of harvested light energy.

Currently, alternate solar cell structures are being explored that utilize nanocomposite structures that mix nanoparticles, such as C-60 or carbon nanotubes, with organic materials having random spatial distributions on a nanoscale. These nanocomposite structures can provide a high density of interfaces between the component materials, effectively enhancing the active regions, analogous to depletion regions in p-n junction semiconductor structures, where charge separation can occur.

However, the nanoscale randomness of the component materials can impede efficient collection of charges at micro- or macro-scale external contacts where charge should be produced, for example, through high electrical resistance through which the charge reaches the contacts. Additionally, these materials, such as conducting polymers, can have relatively high resistivity, further diminishing the efficiency of charge collection at the external contacts.

Furthermore, the limitations of conventional capacitor and battery devices are also well known. Charge storage devices can exhibit similar limitations experienced by conventional solar cell devices discussed above. Electrostatic capacitors that store charge at the surface of electrodes typically do not achieve high areal densities of the electrodes. Electrochemical supercapacitors and batteries that store charge inside their active surfaces and at the surface also can experience similar limitations experienced by conventional solar cell devices discussed above. While sub-surface charge storage can enhance energy density, ion/charge transport into these materials can limit available power.

A number of nanostructures have been explored to improve the power and energy density of conventional solar cell devices and conventional capacitor and battery devices, primarily exploiting higher surface area densities per unit volume of material used in these devices. For example, a high density of nanowires on a surface can substantially enhance the surface area available, producing higher charge density per unit planar area. Furthermore, nanowire and nanotube structures can present shortened pathways for ion transport into the surface, thereby increasing power density. These advancements in technology promise improvements in energy devices, particularly if nanostructures can be formed with sufficient control at the nanoscale to realize functioning and reliable aggregation of massive arrays of nanostructures into larger working devices addressed at the macro- or micro-scale external contacts.

Nanotechnology provides new options for meeting these requirements, particularly using self-assembly phenomena and self-alignment to build more complex nanodevices from simpler nanostructures. For example, anodic aluminum oxide (AAO) can achieve highly regular arrays of nanopores through specific recipes for anodic oxidation of aluminum. Nanopores in AAO may have uniform size and spacing in a hexagonal pattern.

FIG. 1 is a scanning electron micrograph of conventional anodic aluminum oxide nanopore arrays. As illustrated in FIG. 1 in a top view (a) and a side view (b) of the conventional anodic aluminum oxide nanopore arrays, tops of nanopores 1 and 2 each can provide access to narrow columns 3 that can include high aspect ratio nanopore structures. AAO nanopores can be prepared with diameters from 15 to 300 nm, depending on the choice of electrochemical conditions and sequences used during anodization. For nanopores approximately 70 nm in diameter, their center-to-center spacing can be in the order 100 nm. Since the nanopores may be formed to tens of millimeters in depth, very large aspect ratios (depth/diameter) as high as 1000 can be achievable. Furthermore, the density of nanopores, for example $10^{10}/cm^2$, can ensure very large active surface areas per unit area. Typically, this area enhancement can be as high as approximately 500× planar area. Since wet processing can be used, costs associated with vacuum and gas handling technologies can be avoided, and manufacturing costs could be modest. Thus, AAO can provide a cheap and attractive platform for high density nanostructures and devices made from them. A particular advantage of AAO nanostructures can be that massive arrays can be fabricated with a high degree of control over their shape and spatial relationship, including their depth, width, and vertical shape (all controlled by anodization conditions). The regularity which results is ultimately of major value for manufacturability, providing predictability for properties for the full array. The nanopore arrays can have dimensions comparable to that produced by costly, sophisticated lithography and etching processes in the formation of dynamic random access memory capacitors. However, natural self-assembly from the anodization process itself produces the structures without need for such complex manufacturing steps.

Deposition techniques capable of introducing materials for electrical devices into very high aspect ratio nanopores are limited. Physical techniques, such as evaporation and sputter deposition, cannot sufficiently penetrate deeply into the pores, but chemical methods are suitable. Electrochemical deposition, carried out in electrolytic solutions, can successfully cope with the high aspect ratio because electric fields are established between a bottom region of the pore and a counter-electrode removed from the pore in the electrolyte.

FIG. 2 is a schematic view of conventional anodic aluminum oxide nanopores used to create coaxial nanowires. In particular, FIG. 2 illustrates coaxial nanowires formed in AAO nanopores by electro-deposition, including active storage material 1 at the center ($MnO_2$) surrounded by conducting polymer material 2 (PEDOT) to transport charge efficiently to all portions of the $MnO_2$ charge storage electrode. AAO template material 3 can remain near the bottom of the nanowires to retain the array structure, but can be removed above 4 to expose maximum surface area of the nanowires.

Chemical vapor deposition (CVD) is the dominant method for introducing materials into deep, high aspect ratio pores in semiconductor technology, forming the basis for manufacturing of dynamic random access memory capacitors. As semiconductor device technology has faced even more stringent demands for filling narrower, higher aspect ratio pores or trenches, ALD has emerged with unprecedented ability to coat ultra-thin layers of material uniformly in very narrow, very high aspect ratio, 50-100 or more, structures. A close relative of CVD, ALD can utilize self-limiting adsorption and reaction of CVD precursor molecules in alternating sequences to achieve uniform atomic layer thicknesses deep into the nanopores. Thus, ALD can be an ideal candidate for fabrication of AAO-based electrical nanodevices.

At the same time, the high conformality of ALD has its limitations. Higher doses of ALD gases are required for each atomic layer to coat deeper regions of the nanopore. Thus, ALD process recipes can be chosen to fully coat nanopore sidewalls and bottom regions, or alternatively, to coat the sidewalls to a specific depth short of the bottom of the nanopore. This feature offers major advantages in some device configurations in allowing an external contact made at one end of the nanopore to electrically connect to only one material.

FIG. 3 is a transmission electron micrograph illustrating a conventional nanotube created within and release from an aluminum oxide nanopore. FIG. 3 further illustrates a nanotube made by ALD $HfO_2$ deposition into an AAO nanopore template and subsequent removal of the AAO material to allow the resulting ALD nanotube to be observed in transmission electron microscopy. Darker portions 1 in the images indicate the outer and inner diameter at the ALD nanotube sides, while lighter portions 2 therebetween reflect attenuation by the walls of the top and bottom regions.

The combination of self-assembled AAO nanopores and self-aligned, self-limiting ALD can enable the fabrication of energy devices within the AAO nanopores. Using vertical nanopores that are formed by anodic oxidation of an aluminum thick film, metal-insulator-metal (MIM) electrostatic capacitors have been fabricated, as described by Banerjee et al. (Nature Nanotechnology, submitted for publication).

FIGS. 4a, 4b, and 4c each illustrate the investigated MIM structure investigated. In particular, FIG. 4a is a schematic view of a conventional metal-insulator-metal nanocapacitor structure fabricated by multiple atomic layer deposition steps in anodic aluminum oxide nanopores. As seen in the schematic of FIG. 4a, anodic oxidation of aluminum 1 can cause formation of aluminum oxide $Al_2O_3$ 2 with deep pores on whose surfaces a sequence of ALD layers can be deposited to create MIM device structure 3. The detailed structure of MIM layers is seen by scanning electron microscopy in FIGS. 4b and 4c for regions at the top and bottom of the nanopores, respectively. The pore diameter was 60 nm, the bottom TiN electrode thickness was 5.6 nm, the $Al_2O_3$ dielectric thickness was 6.6 nm, and the top TiN electrode thickness was 12.6 nm, nearly filling the nanopore. It should be noted that layer thicknesses could be readily adjusted to fully fill the nanopore or instead to leave internal volume. The pore depth for the structures shown in FIGS. 4a, 4b, and 4c was 1 mm.

Further, Banerjee, et al. investigated MIM nanocapacitor arrays for both 1 and 10 μm pore depths, forming capacitors whose macroscopic external contacts to the TiN ALD layers in the MIM structure were made above the nanopores and to the underlying aluminum below the nanopores. Capacitors with 0.01267 $mm^2$ area (about 0.1 mm in diameter) connected approximately $10^6$ nanocapacitor structures like those in FIGS. 4a, 4b, and 4c in parallel and indicated capacitance densities of 9 and 90 $\mu F/cm^2$, respectively. This corresponds to an energy density of order 0.7 W-h/kg, placing the performance of these devices well above the energy density of conventional electrostatic capacitors, while retaining comparable power. While further work is needed to improve leakage current levels and to address other issues, this work on vertical capacitor devices demonstrates the high potential of combining AAO and ALD technologies to create nanostructures optimized for energy device applications.

The drawbacks of such vertical nanodevice structures are (1) their difficulty in their fabrication and (2) the challenge of scaling to higher performance. High quality nanopore arrays can require relatively thick films of aluminum, micrometers in depth to obtain controlled dimensionalities as seen in FIG. 1. Furthermore, patterning of nanopore arrays and devices to construct micro- and macro-scale devices for external contacts can require a sequence of conventional device fabrication steps normally performed on semiconductor wafers or other flat substrates. The thick aluminum films required could necessitate very long deposition times if formed by thin film deposition. Instead, Banerjee et al. developed an anodic bonding technique for bonding the initial aluminum film to a substrate to facilitate subsequent device fabrication steps, for example, making test capacitors. These problems increase if nanopore depths are to be scaled more aggressively for higher performance devices, for example, deeper nanopores. Given the difficulty in creating thick aluminum starting films for vertical nanopores, one may recognize that the vertical technology does not scale to multiple layers on top of each other, as would be desired to increase capacitance density or other energy-related functionality. This also could preclude construction of heterogeneous integrated systems, for example, combining solar or thermoelectric energy capture or generation with electrical energy storage.

Accordingly, what is needed are an apparatus, system, and method for a lateral two-terminal nanotube device configured to capture and generate energy, to store electrical energy, and to integrate these functions with power management circuitry.

Furthermore, an apparatus, system, and method are needed for lateral two-terminal nanotube devices that utilize nanostructures having nanopores formed by anodic oxidation of aluminum, and thin films deposited by atomic layer deposition and electrochemical deposition to form devices in the nanopores. Further, what is needed are an apparatus, system, and method where the nanostructures are coupled to one another to form larger assemblies suitable for power and energy systems.

Furthermore, an apparatus, system and method are needed for lateral two-terminal nanotube devices for capture, generation and storage of energy based on multi-component materials contained within lateral nanoscale pores in aluminum oxide or another dielectric material. Further, what is needed are an apparatus, system, and method where a plurality of lateral two-terminal nanotube devices are wired in parallel to capture energy from light, either solar or ambient, and to generate energy from temperature gradients sensed by thermoelectric devices.

Furthermore, what is needed are an apparatus, system, and method for electrostatic capacitors, electrochemical capacitors, and batteries for energy storage, whereby device layers for energy capture, generation, or storage, can be combined one on top of another or laterally to provide enhanced functionality, including energy and power management systems and electrical power management circuitry with components for capture, generation, storage and distribution.

No prior arrangements have provided an apparatus, system, and method for a lateral two-terminal nanotube device configured to capture and generate energy, to store electrical energy, and to integrate these functions with power management circuitry.

SUMMARY OF THE INVENTION

In accordance with an embodiment of the present invention, there is provided a lateral nanotube device. The lateral nanotube device can include a substrate, an anodic oxide material disposed on the substrate, and a column disposed in the anodic oxide material extending from one distal end of the anodic oxide material to another end of the anodic oxide material. The lateral nanotube device further can include a first material disposed within the column, and a second material disposed within the column. The first material can fill a distal end of the column and gradiently decrease towards another distal end of the column along inner walls of the column. The second material can fill the another distal end of the column and gradiently decrease towards the distal end of the column within the first material.

In accordance with an embodiment of the present invention, there is provided an apparatus. The apparatus can include a substrate, an anodic oxide material disposed on the substrate, and a plurality of columns. Each column can be disposed in the anodic oxide material extending from one distal end of the anodic oxide material to another end of the anodic oxide material. The apparatus further can include a first material disposed within each column, and a second material disposed within each column. The first material can fill a distal end of each column and gradiently decrease towards another distal end of each column along inner walls of each column. The second material can fill the another distal end of each column and gradiently decrease towards the distal end of each column within the first material.

In accordance with an, embodiment of the present invention, there is provided a lateral nanotube device. The lateral nanotube device can include a substrate, an anodic oxide material disposed on the substrate, and a column disposed in the anodic oxide material extending from one distal end of the anodic oxide material to another end of the anodic oxide material. The lateral nanotube device further can include a first material disposed within the column, and a second material disposed within the column. The lateral nanotube device further can include a third material disposed between the first material and the second material. The first material can fill a distal end of the column and gradiently decrease towards another distal end of the column along inner walls of the column. The second material can fill the another distal end of the column and gradiently decrease towards the distal end of the column within the first material.

In accordance with an embodiment of the present invention, there is provided a system. The system can include a plurality of lateral nanotube devices configured one on top of each other. Each lateral nanotube device can include a substrate, an anodic oxide material disposed on the substrate, and a column disposed in the anodic oxide material extending from one distal end of the anodic oxide material to another end of the anodic oxide material. Each lateral nanotube device further can include a first material disposed within the column, and a second material disposed within the column. The first material can fill a distal end of the column and gradiently decrease towards another distal end of the column along inner walls of the column. The second material can fill the another distal end of the column and gradiently decrease towards the distal end of the column within the first material.

According still to another embodiment of the present invention, there is provided a system. The system can include a plurality of lateral nanotube devices configured one on top of each other. Each lateral nanotube device can include a substrate, an anodic oxide material disposed on the substrate, and a column disposed in the anodic oxide material extending from one distal end of the anodic oxide material to another end of the anodic oxide material. Each lateral nanotube device further can include a first material disposed within the column, and a second material disposed within the column. A third material can be disposed between the first material and the second material. The first material can fill a distal end of the column and gradiently decrease towards another distal end of the column along inner walls of the column. The second material can fill the another distal end of the column and gradiently decrease towards the distal end of the column within the first material.

According still to another embodiment of the present invention, there is provided a system. The system can include a first lateral nanotube device including an energy storage device, and a second lateral nanotube device including an energy capture device. The first lateral nanotube device and the second lateral nanotube device can be configured one on top of the other to capture and store energy.

According still to another embodiment of the present invention, there is provided a method. The method can include the steps for etching a passivation layer and an aluminum layer disposed on a substrate to expose portions of the aluminum layer, and forming a pore at each distal end of an exposed portion of the aluminum layer such that the pores connect to form a single columnar pore. The method further can include the steps for depositing a first material into a distal end of the columnar pore, and depositing a second material into another distal end of the columnar pore. The depositing the first material can include filling the distal end of the columnar pore with the first material and gradiently decreasing towards the another distal end of the columnar pore along inner walls of the columnar pore. The depositing the second material further can include filling the another distal end of the columnar pore with the second material and gradiently decreasing towards the distal end of the columnar pore within the first material.

According still to another embodiment of the present invention, there is provided a method. The method can include the steps for etching a passivation layer and an aluminum layer disposed on a substrate to expose a portion of the aluminum layer, forming a first pore in the exposed portion of the aluminum layer, and depositing a first material into the first pore. The method further can include the steps for etching the passivation layer and the aluminum layer to expose another portion of the aluminum layer, and forming a second pore in the another exposed portion of the aluminum layer such that the first pore and the second pore connect to form a single columnar pore. The method further can include the steps for depositing a second material into the second pore. The depositing the first material can include filling the distal end of the columnar pore with the first material and gradiently decreasing towards the another distal end of the columnar pore along inner walls of the columnar pore. The depositing the second material further can include filling the another distal end of the columnar pore with the second material and gradiently decreasing towards the distal end of the columnar pore within the first material.

According still to another embodiment of the present invention, there is provided a method. The method can include the steps for etching a passivation layer and an aluminum layer disposed on a substrate to expose portions of the aluminum layer, connecting a first wiring structure at a distal end of an exposed portion of the aluminum layer, and forming a pore at each distal end of an exposed portion of the aluminum layer using the first wiring structure such that the pores connect to form a single columnar pore. A column can be formed between the pores in the aluminum layer. The method further can include steps for removing the first wiring structure, depositing a first material into a distal end of the columnar pore, and depositing a second material into another distal end of the columnar pore. The depositing the first material can include filling the distal end of the columnar pore with the first material and gradiently decreasing towards the another distal end of the columnar pore along inner walls of the columnar pore. The depositing the second material can include filling the another distal end of the columnar pore with the second material and gradiently decreasing towards the distal end of the columnar pore within the first material.

According still to another embodiment of the present invention, there is provided a method. The method can include the steps for etching a passivation layer and an aluminum layer disposed on a substrate to expose portions of the aluminum layer, and connecting a first wiring structure to the aluminum layer at a position other than a distal end of the exposed portions of the aluminum layer. The method further can include the steps for forming a pore at each distal end of an exposed portion of the aluminum layer such that each pore extends to a region close to the position of the first wiring structure connection, and forming a connection between each pore and the first wiring structure, such that the connection forms a columnar pore in the aluminum layer. The method further can include the steps for depositing a first material into a distal end of the columnar pore, and depositing a second material into another distal end of the columnar pore. The first material can fill the distal end of the columnar pore and gradiently decreases towards the another distal end of the columnar pore along inner walls of the columnar pore. The second material can fill the another distal end of the columnar pore and gradiently decreases towards the distal end of the columnar pore within the first material.

BRIEF DESCRIPTION OF THE DRAWINGS

Further aspects, details, advantages and modifications of the present invention will become apparent from the following detailed description of the preferred embodiments which is to be taken in conjunction with the accompanying drawings, in which:

FIG. 3 is a transmission electron micrograph illustrating a conventional nanotube created within and release from an aluminum oxide nanopore.

FIG. 4a is a schematic view of a conventional metal-insulator-metal nanocapacitor structure fabricated by multiple atomic layer deposition steps in anodic aluminum oxide nanopores.

FIG. 4b is a scanning electron micrograph of the conventional metal-insulator-metal nanocapacitor structure illustrated in FIG. 4a.

FIG. 4c is another scanning electron micrograph of the conventional metal-insulator-metal nanocapacitor structure illustrated in FIG. 4a.

FIG. 5b is a scanning electron micrograph of the conventional process for growing the lateral nanopores in the anodic aluminum oxide illustrated in FIG. 5a.

FIG. 7a is a representative geometry for materials within a solar cell nanodevice, in accordance with an embodiment of the present invention.

FIG. 7b is another representative geometry for materials within the solar cell nanodevice, in accordance with an embodiment of the present invention.

FIG. 7c is another representative geometry for materials within the solar cell nanodevice, in accordance with an embodiment of the present invention.

FIGS. 11a-11i are steps of a process for creating lateral two-terminal nanotube devices, in accordance with an embodiment of the present invention.

DETAILED DESCRIPTION OF THE PREFERRED EMBODIMENTS

Reference will now be made in detail to the preferred embodiments of the present invention, examples of which are illustrated in the accompanying drawings.

Certain embodiments of the present invention provide an apparatus, system, and method for lateral two-terminal nanotube devices formed within lateral anodic oxide nanopores. Furthermore, certain embodiments of the present invention provide an apparatus, system, and method for a process for fabricating lateral two-terminal nanotube devices, whereby the lateral two-terminal nanotube devices in a single layer can be connected in parallel or on top of one another using conventional micro-fabrication techniques without need for nanolithography. Accordingly, multiple layers of lateral two-terminal nanotube devices can be created, achieving thin film systems that can integrate energy capture and generation, electrical energy storage, and power management.

Figure 5A:
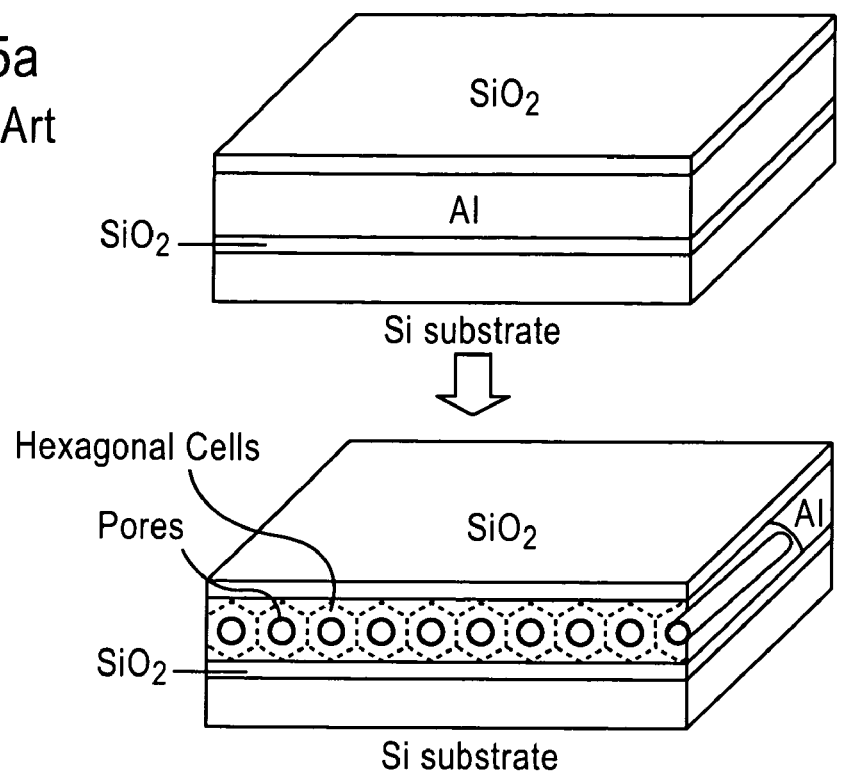
FIG. 5a is a schematic view of conventional process for growing lateral nanopores in anodic aluminum oxide.
Figure 5B:
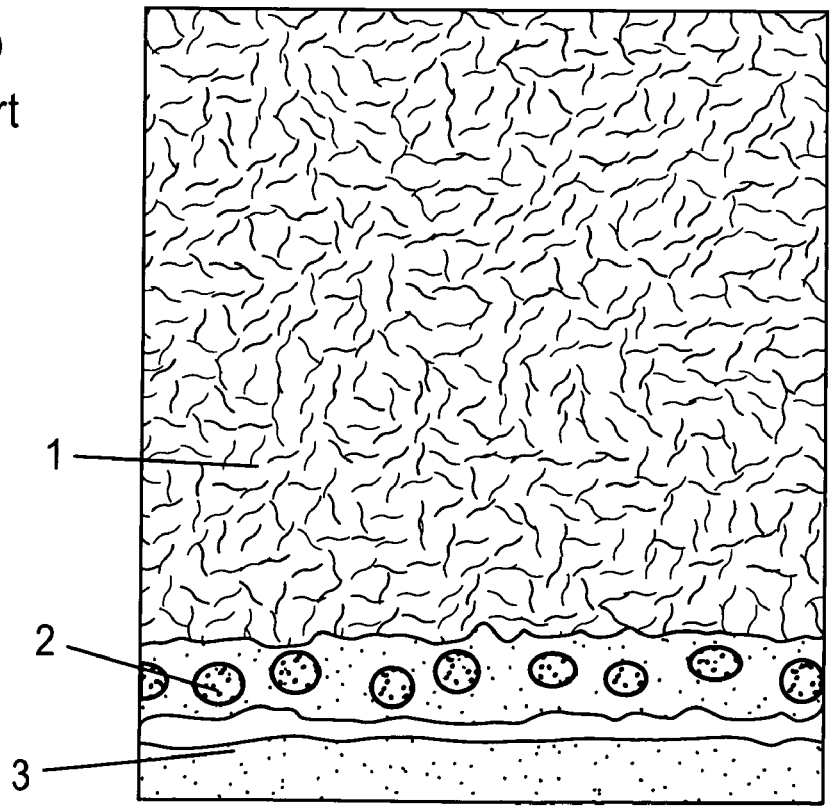

While vertical nanopore devices are promising for a range of applications, the limitations of the vertical configuration pose serious manufacturing problems and seem to preclude scaling to higher performance and multifunctional device systems. Recently it has been shown in H. G. Zhang, Z. Chen, T. X. Li, F. J. Wang and K. Saito, *Journal of the Electrochemical Society*, 154(2), H124-H126 (2007), that anodic aluminum oxide nanopores can be formed laterally from the edges of an aluminum thin film passivated above and below. FIG. 5a is a schematic view of conventional process for growing lateral nanopores in anodic aluminum oxide. FIG. 5b is a scanning electron micrograph of the conventional process for growing the lateral nanopores in the anodic aluminum oxide illustrated in FIG. 5a. Depending on the thickness of the aluminum film, a single lateral row of nanopores or multiple layers of nanopores can be created. However, the possibility of combining atomic layer deposition and/or electrochemical deposition techniques to create functional devices within lateral AAO nanopores has not been recognized in the prior art.

Figure 6A:
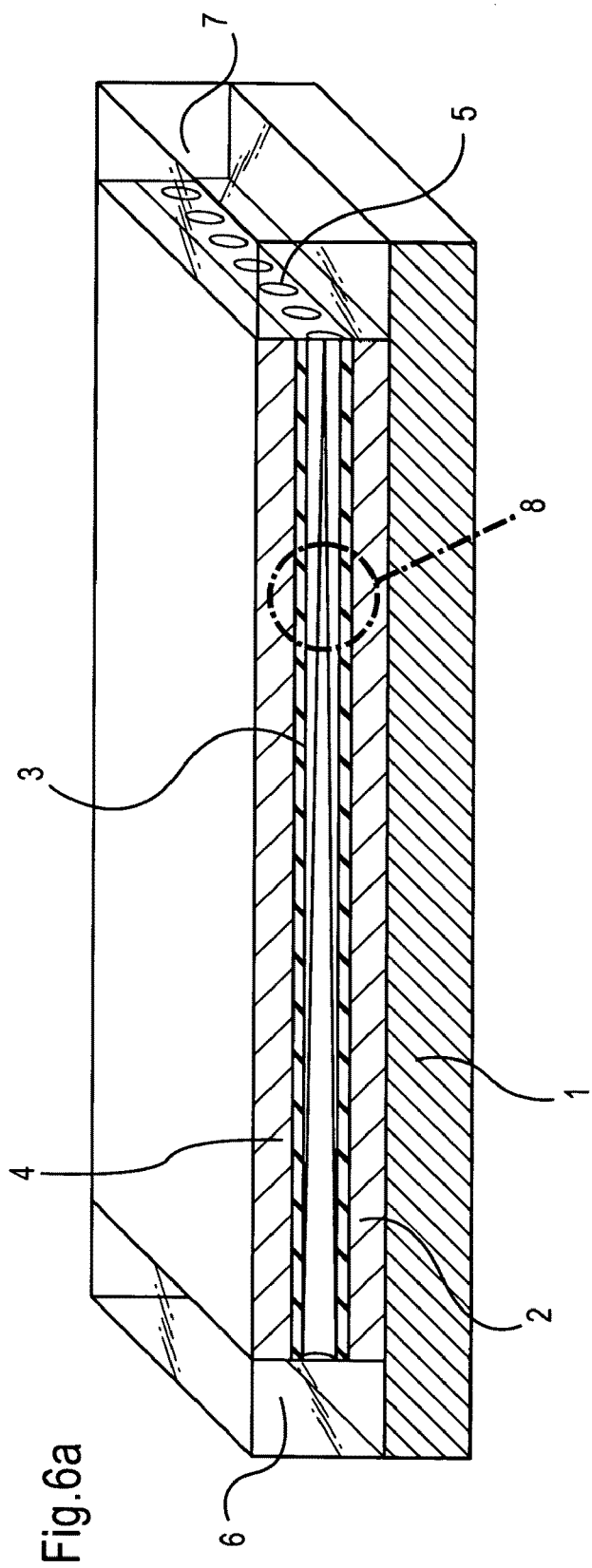
FIG. 6a is schematic view of a lateral two-terminal nanotube device, in accordance with an embodiment of the present invention.

FIG. 6a is schematic view of a lateral two-terminal nanotube device, in accordance with an embodiment of the present invention. As illustrated in FIG. 6a, a layer structure can be formed on substrate 1. Substrate 1 can be rigid or flexible and include a rectangular patterned area and insulating thin film 2. Active nanopore device layer 3 can be formed above insulating thin film 2 and below second insulating thin film 4. Nanopore device layer 3 can include a plurality of nanopores 5 each extending laterally through nanopore device layer 3.

Electrical access to exposed ends of the plurality of nanopores 5 can be achieved at first end 6 of nanopore device layer 3 and at second end 7 of nanopore device layer 3.

Figure 6B:
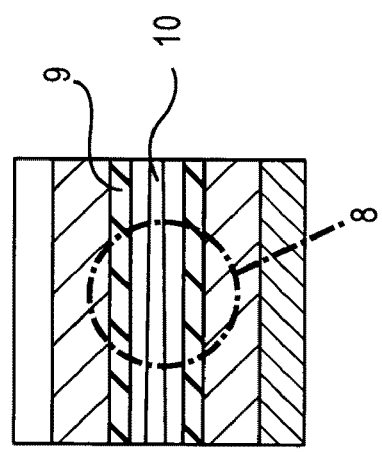
FIG. 6b is an exploded view of a nanopore device layer of the lateral two-terminal nanotube device, in accordance with an embodiment of the present invention.

FIG. 6b is an exploded view of a nanopore device layer of the lateral two-terminal nanotube device, in accordance with an embodiment of the present invention. As shown in region 8, nanopore device layer 3 can include an anodic oxide material. The anodic oxide material can include anodic aluminum oxide, titanium oxide, silicon, or a dielectric material. For purposes of further description of the embodiments of the present invention, AAO will be described. The AAO can include a thickness in the range of 25 nm to 1 millimeter.

At least one nanopore 10 can be formed within the AAO, extending from first distal end 6 of nanopore device layer 3 to second distal end 7 of nanopore device layer 3. Each nanopore 10 can have a diameter, a width, and/or a thickness in the range of 5-1000 nm, and more preferably in the range of 15-300 nm. Each nanopore 10 can be formed of materials selected for their ability to capture, generate or store electrical energy, as will be discussed below.

As will be illustrated in FIGS. 7-11, a first material can be disposed within each nanopore 10, filling first distal end 6 of nanopore 10, and gradiently decreasing towards second distal end 7 of the nanopore 10 along the inner walls of nanopore 10. Further, a second material can be disposed within each nanopore 10, filling second distal end 7 of the nanopore 10, and gradiently decreasing towards first distal end 6 of the nanopore 10 within the first material. Accordingly, the first material and the second material can be concentrically disposed within each nanopore 10. Further, electrical contacts can be connected to the first and second material at first distal end 6 and second distal end 7, respectively, of each nanopore 10.

FIGS. 7a and 7b are representative geometries for materials within a solar cell nanodevice, in accordance with embodiments of the present invention. As illustrated in FIGS. 7a and 7b, a solar cell nanodevice can include a nanopore formed within the AAO, whereby the nanopore can extend from a first distal end of the AAO to a second distal end of the AAO. The nanopore can include first material 1, filling the first distal end of the nanopore, and gradiently decreasing towards the second distal end of the nanopore along the inner walls of the nanopore. In a solar cell nanodevice, first material 1 can be a n-type semiconductor material. The nanopore can further include second material 2, filling the second distal end of the nanopore, and gradiently decreasing towards the first distal end of the nanopore within the first material. In the solar cell nanodevice, second material 2 can be a p-type semiconductor material.

FIG. 7c is another representative geometry for materials within the solar cell nanodevice, in accordance with an embodiment of the present invention. As illustrated in FIG. 7c, at least one nanopore can be formed within AAO 3, whereby each nanopore can extend from one distal end of AAO 3 to the other distal end of AAO 3. As previously discussed for FIGS. 7a and 7b, the nanopore can include first material 4, filling the first distal end of the at least one nanopore, and gradiently decreasing towards the second distal end of the at least one nanopore along the inner walls of the at least one nanopore. In a solar cell nanodevice, first material 4 can be a n-type semiconductor material. The nanopore can further include second material 5, filling the second distal end of each nanopore, and gradiently decreasing towards the first distal end of the nanopore within the first material. In the solar cell nanodevice, second material 5 an be a p-type semiconductor material. Electrical contacts 6, 7 can be connected to the exposed ends of the first and second material at the distal ends of the nanopore to form a lateral two-terminal solar cell nanotube device within the AAO nanopore.

Figure 7D:
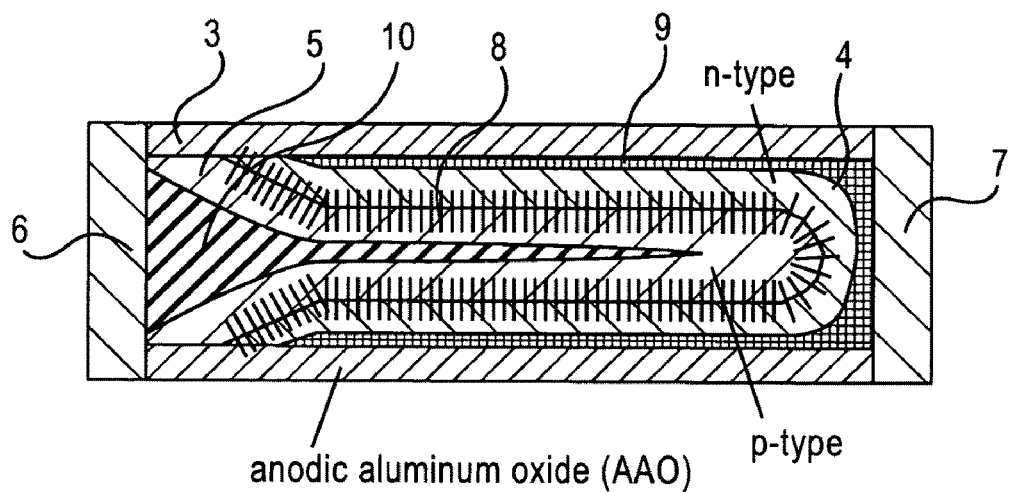
FIG. 7d is another representative geometry for materials within the solar cell nanodevice, in accordance with an embodiment of the present invention.

FIG. 7d is another representative geometry for materials within the solar cell nanodevice, in accordance with an embodiment of the present invention. As illustrated in FIG. 7d, a first conducting layer 9 can be disposed on an outer layer of first material 4. Further, a second conducting layer 10 can be disposed within second material 5.

Further, depletion region 8 can be formed at the interface between n-type semiconductor material 4 and p-type semiconductor material 5, producing an internal electrical field for separating charges created by light absorption. In the lateral two-terminal nanotube device according to embodiments illustrated in FIGS. 7a, 7b, 7c, and 7d the volume of depletion region 8 can extend along a significant portion of the nanopore, for example, at least 25% of a length of the nanopore. Further, the at least one nanopore can constitute a significant portion of the total volume of the thin film structure illustrated in FIG. 6. These characteristics can result from the combination of materials formed at the nanoscale level for producing maximum active volumes for light absorption and charge separation. Accordingly, certain embodiments of the present invention can produce a favorable energy capture per unit volume and per unit weight in solar cell devices.

A similar arrangement can be provided, as described above and illustrated in FIGS. 7a, 7b, 7c, and 7d, whereby the lateral two-terminal nanotube device is a light emitting diode or a laser.

Figure 8:
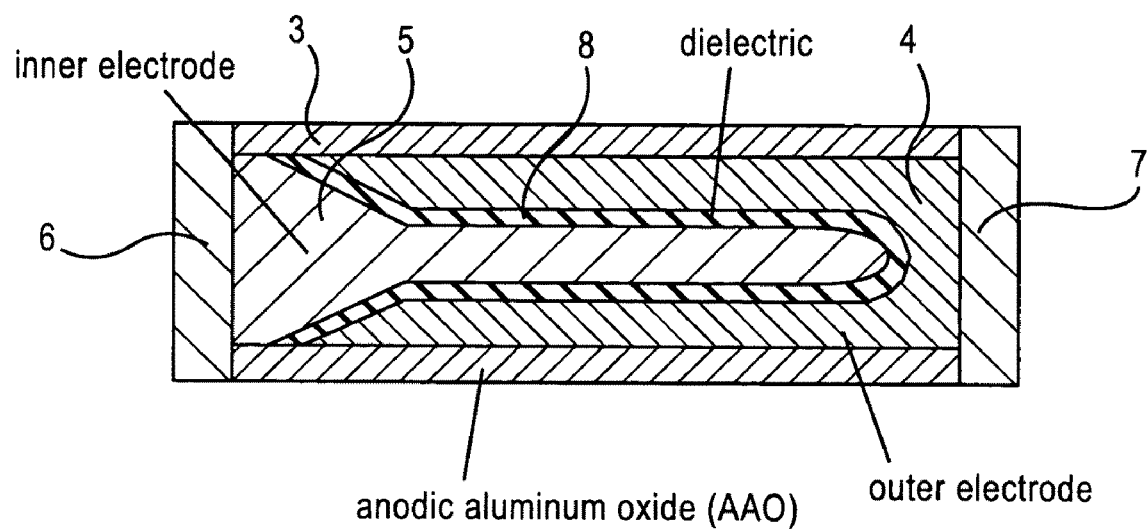
FIG. 8 is a representative geometry for materials within a capacitor nanodevice, in accordance with an embodiment of the present invention.

FIG. 8 is a representative geometry for materials within a capacitor nanodevice, in accordance with an embodiment of the present invention. As illustrated in FIG. 8, the capacitor nanodevice can include at least one nanopore formed within AAO 3, whereby each nanopore can extend from one distal end of AAO 3 to the other distal end of AAO 3. Each nanopore can include first material 4, as an outer electrode, filling the first distal end of the nanopore, and gradiently decreasing towards the second distal end of the nanopore along the inner walls of the nanopore. Each nanopore can further include second material 5, as an inner electrode, filling the second distal end of each nanopore, and gradiently decreasing towards the first distal end of the nanopore within the first material. Electrical contacts 6, 7 can be connected to the exposed ends of the first and second material at the distal ends of the nanopore to form a lateral two-terminal capacitor nanotube device within the AAO nanopore.

The outer electrode of first material 4 and the inner electrode of second material 5 can be separated by dielectric layer 8, producing an internal electrical field for separating charges created by light absorption. In the lateral two-terminal nanotube device according to certain embodiments illustrated in FIG. 8, the volume of dielectric layer 8 can extend along a significant portion of the nanopore, for example, at least 25% of a length of the nanopore. Further, the at least one nanopore can constitute a significant portion of the total volume of the thin film structure illustrated in FIG. 6. These characteristics can result from the combination of materials formed at the nanoscale level for producing maximum active volumes for light absorption and charge separation. Accordingly, certain embodiments of the present invention can produce a favorable energy capture per unit volume and per unit weight in solar cell devices.

A similar arrangement can be provided, as described above and illustrated in FIG. 8, whereby the lateral two-terminal nanotube device is at least one of a battery or a supercapacitor.

Figure 2:
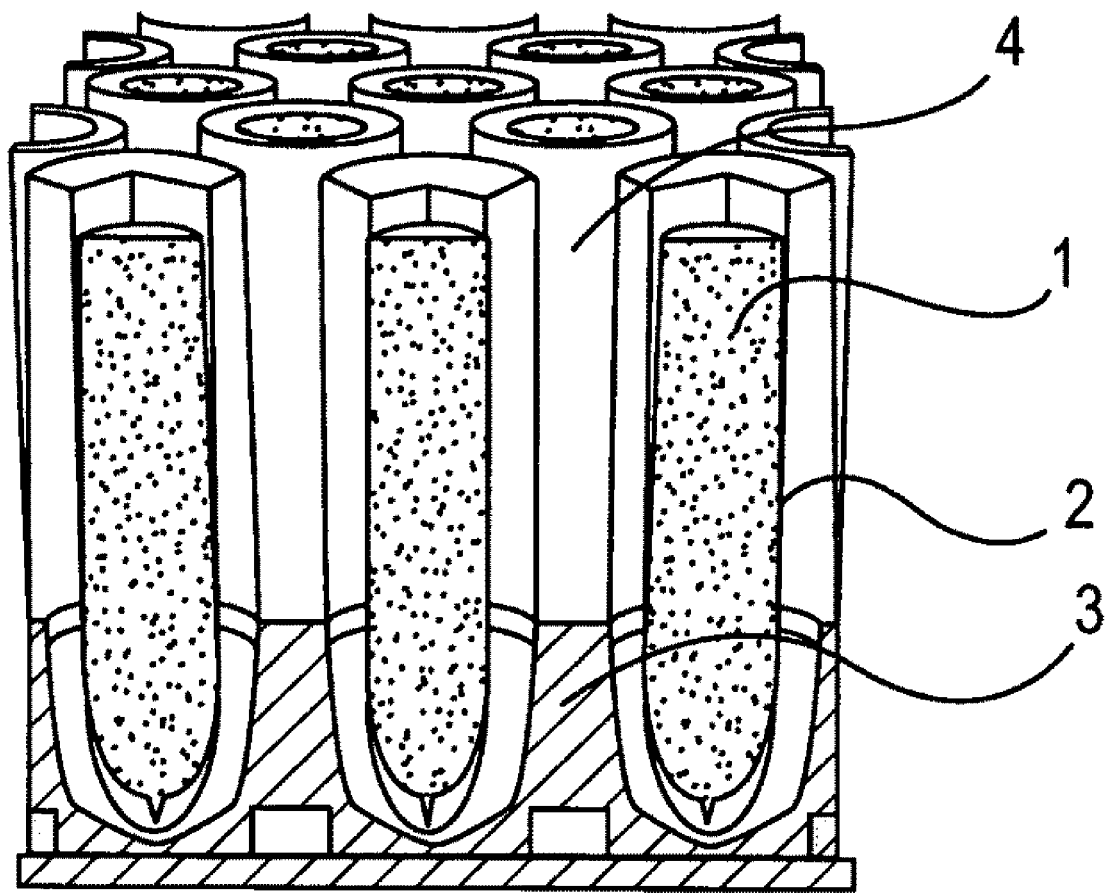
FIG. 2 is a schematic view of conventional anodic aluminum oxide nanopores used to create coaxial nanowires.

As described above for FIGS. 7a, 7b, 7c, and 8, the AAO-based, lateral two-terminal nanotube device can facilitate wiring of multiple nanotube devices in parallel by electrical contacts at the distal ends of each nanopore device. ALD, as illustrated in FIG. 2, and ECD, as illustrated in FIG. 4, can be used to deposit nanoscale material layers for the geometries of the AAO-based, lateral two-terminal nanotube devices. Furthermore, the ability of ALD to control the penetration of conformal films into the nanopores is promising for tailoring the thickness profiles of the AAO-based, lateral two-terminal nanotube devices illustrated in FIGS. 7a, 7b, 7c, and 8.

Figure 9:
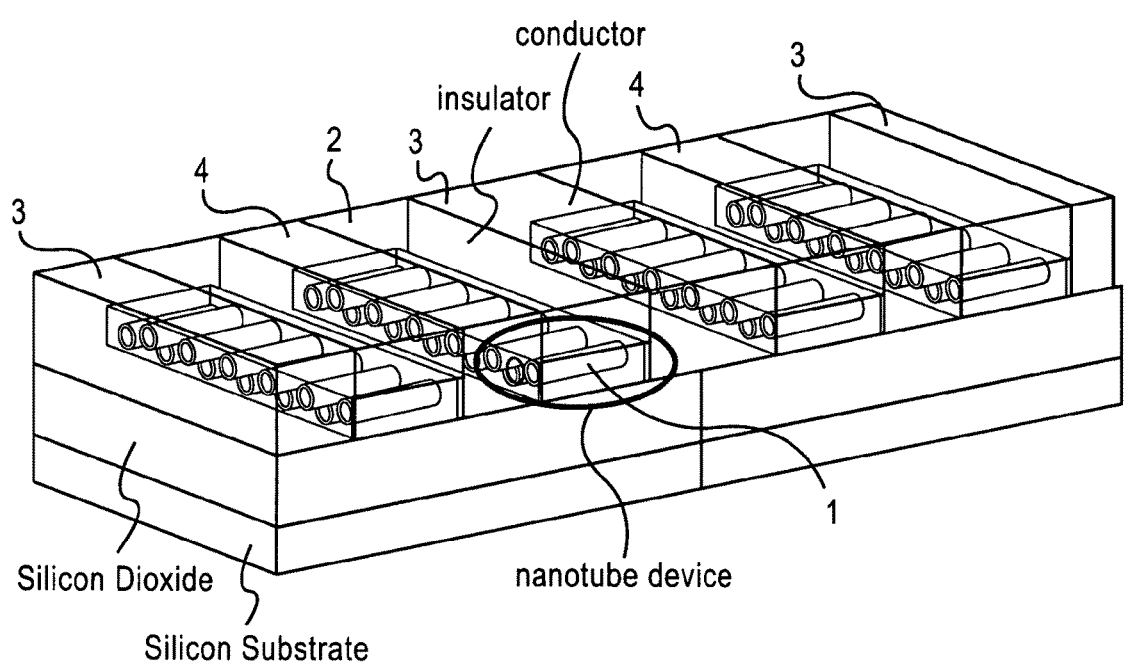
FIG. 9 is a schematic view of multiple lateral two-terminal nanotube devices configured for contacts and wiring into multiple arrays of nanotube devices, in accordance with an embodiment of the present invention.

FIG. 9 is a schematic view of multiple lateral two-terminal nanotube devices configured for contacts and wiring into multiple arrays of nanotube devices, in accordance with an embodiment of the present invention. An individual lateral two-terminal nanotube device 1, encased in AAO (not shown), can be located below insulating layer 2 and electrically coupled with conducting elements 3 and 4, whereby conducting elements 3 and 4 electrically couple multiple lateral two-terminal nanotube devices together. Because each lateral two-terminal nanotube device can include two terminals, an array of identical lateral two-terminal nanotube devices can be designed so that each conducting element 3 and 4 can electrically coupled to the same material or same functional end of the lateral two-terminal nanotube device. For example, conducting element 3 can contact the n-type semiconductor material ends of each solar cell nanotube device, while conducting element 4 can contact the p-type semiconductor material ends of each solar cell nanotube device. For example, as illustrated in FIG. 9, the sequence of materials can include conducting element 3, n-type material, p-type material, conducting element 4, p-type material, n-type material, conducting element 3, etc.

An architecture of multiple lateral two-terminal nanotube devices, as illustrated in FIG. 9, can be compatible with stacking each lateral two-terminal nanotube device one on top of another.

Figure 10:
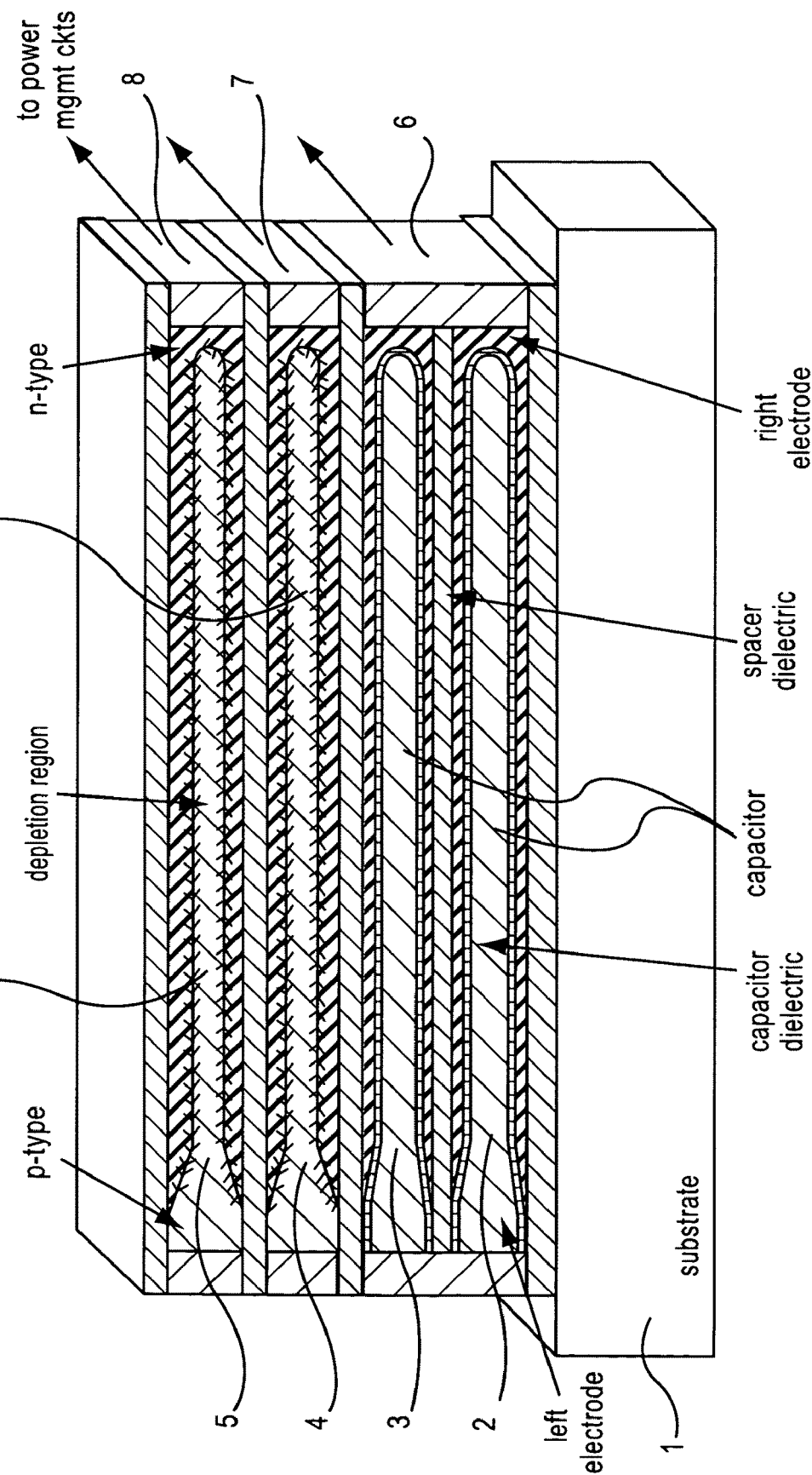
FIG. 10 is an integrated system combining energy capture and storage functionalities coupled to power management circuitry to achieve a multifunctional energy system, in accordance with an embodiment of the present invention.

FIG. 10 is an integrated system combining energy capture and storage functionalities coupled to power management circuitry to achieve a multifunctional energy system, in accordance with an embodiment of the present invention. As illustrated in FIG. 10, lateral two-terminal nanopore capacitor 2 can be formed on substrate 1 with a second-level lateral two-terminal nanopore capacitor 3 formed directly above it. Substrate 1 can include a rectangular patterned area. Electrical contacts 6 electrically couple electrodes in lateral two-terminal nanopore capacitors 2 and 3 in parallel with one another to enhance the capacitance and energy storage available in the thin film structure.

Lateral two-terminal nanotube solar cells 4, 5 can be further located above lateral two-terminal nanopore capacitors 2, 3. By choosing a different set of materials, i.e. different set of materials selected for the first material and the second material within the nanopore, different portions of the optical spectrum may be emphasized in collecting energy by two lateral two-terminal nanotube solar cells 4, 5, for example, a long wavelength radiation at solar cell 4 and a shot wavelength radiation at solar cell 5. Because their output voltages may be different, electrical contacts 7 to solar cell 4 and electrical contacts 8 to solar cell 5 can be wired separately, although in certain embodiments of the present invention, they can be wired in parallel.

The voltages involved in portions of the system illustrated in FIG. 10 can be different and time-dependent, for example, from different outputs of the solar cells and the time variation of radiation. To manage energy capture and distribution efficiently, additional circuitry may be needed to manage energy and power transfer between the various devices and loads. This is suggested by the connection of electrical contacts 6, 7, and 8 in FIG. 10 to power management circuitry. Such power management circuitry can be realized in the form of thin film transistor circuits, which are compatible with the thin film structures in which the lateral two-terminal nanopore devices are made. Such circuitry can be produced as yet another layer of thin film microstructures, or laterally separated from the energy capture and storage devices shown in FIG. 10.

FIGS. 11a-11i are steps of a process for creating lateral two-terminal nanotube devices, in accordance with an embodiment of the present invention.

Figure 11A:
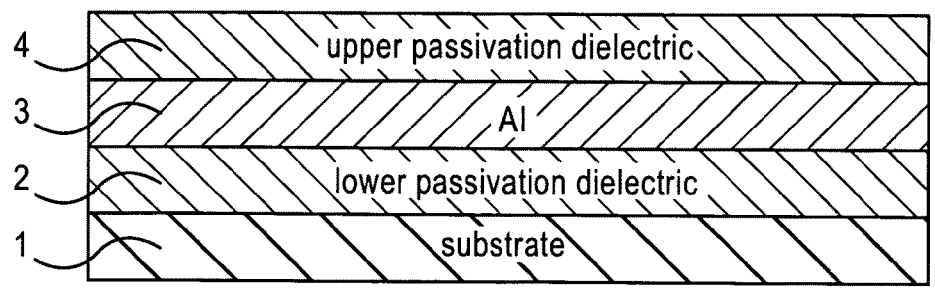
Figure 11B:
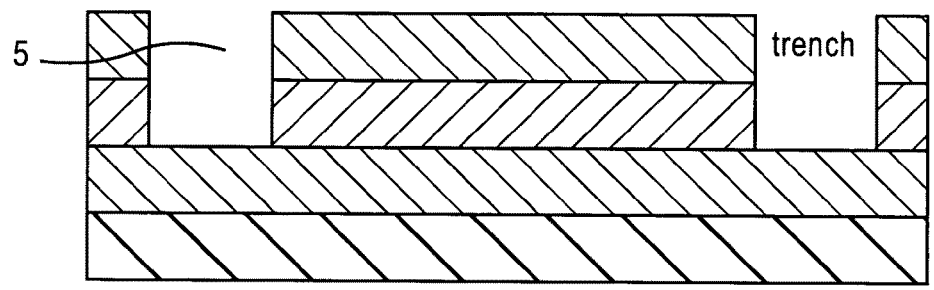
Figure 11C:
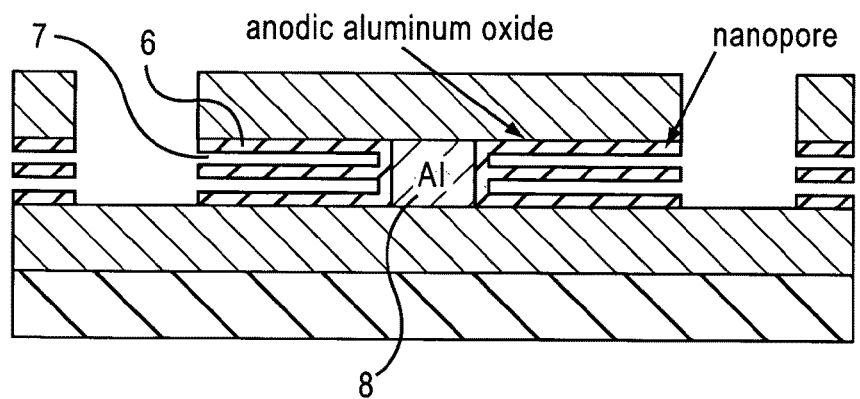

In FIG. 11a, the process can include depositing lower passivation dielectric 2, aluminum film 3, and upper passivation dielectric 4 on substrate 1. The passivation dielectrics permit electrical isolation of aluminum film 3 and prevent an electrochemical reaction of aluminum film 3 from occurring, except where purposely exposed to activate the lateral anodization process. Accordingly, when substrate 1 is an insulating substrate, then lower passivation dielectric 2 may be optional. Furthermore, lower passivation dielectric 2, aluminum film 3, and upper passivation dielectric 4 can be patterned. In FIG. 11b, the process can include lithographically defining trenches 5 and etching through aluminum film 3 and upper passivation dielectric 4 to expose the ends of aluminum film 3. In FIG. 11c, the process may include electrochemically anodizing, or oxidizing, aluminum film 3 at the exposed ends of aluminum film 3 to form AAO material 6, whereby AAO material 6 extends part way into aluminum film 3. Further, the electrochemical anodization, or oxidation, of aluminum film 3 creates lateral nanopores 7 in AAO material 6. Lateral nanopores 7 can be open to trenches 5. Contact can be made to aluminum layer 8 at other locations separated from the lateral two-terminal nanopore devices shown so that the electrochemical reaction can continue to produce AAO material 6 and nanopores 7, while retaining the electrical connection to aluminum layer 8 of AAO material 6 and nanopore regions during their formation.

It will be recognized by one of ordinary skill in the art that other variants of steps (a), (b), and (c) can be substituted, as illustrated by the following examples. Numerous choices exist as locations for the remote electrical contact to aluminum film 3 for electrochemical anodization. Metals other than aluminum may also be suitable for anodization and for formation of nanopores in the dielectric material. Trench etching can be accomplished by dry or wet etching. The passivation dielectrics can be chosen from a variety of materials and processes. For example, upper passivation dielectric 4 can be AAO under conditions that do not form nanopores, since growth of AAO with and without nanopores can achieve similar adhesion and stability regarding materials mismatched at their interface.

Figure 1A:
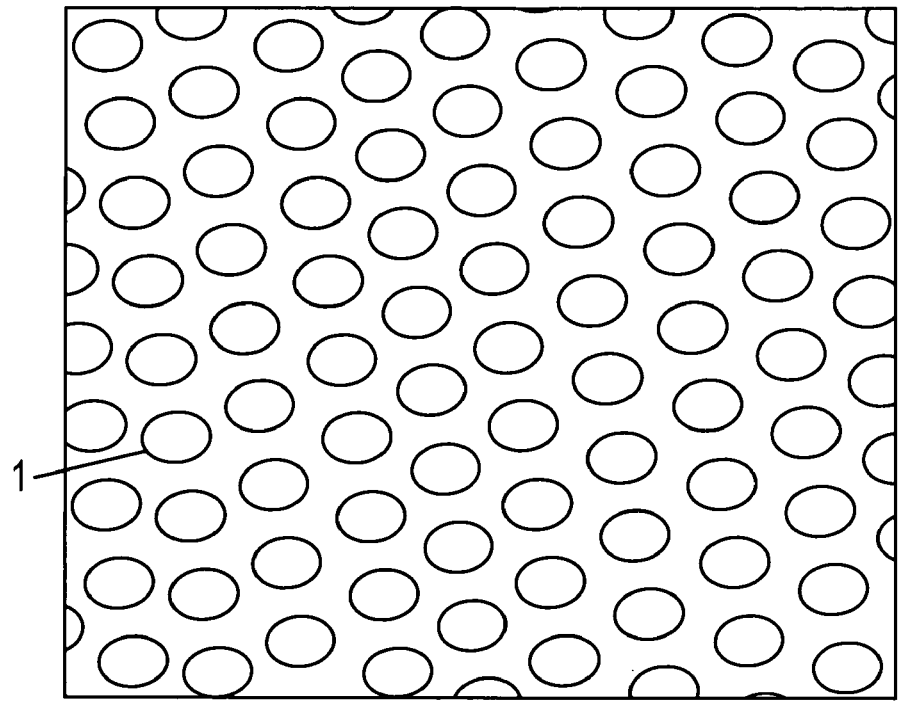
FIG. 1 is a scanning electron micrograph of conventional anodic aluminum oxide nanopore arrays.
Figure 1B:
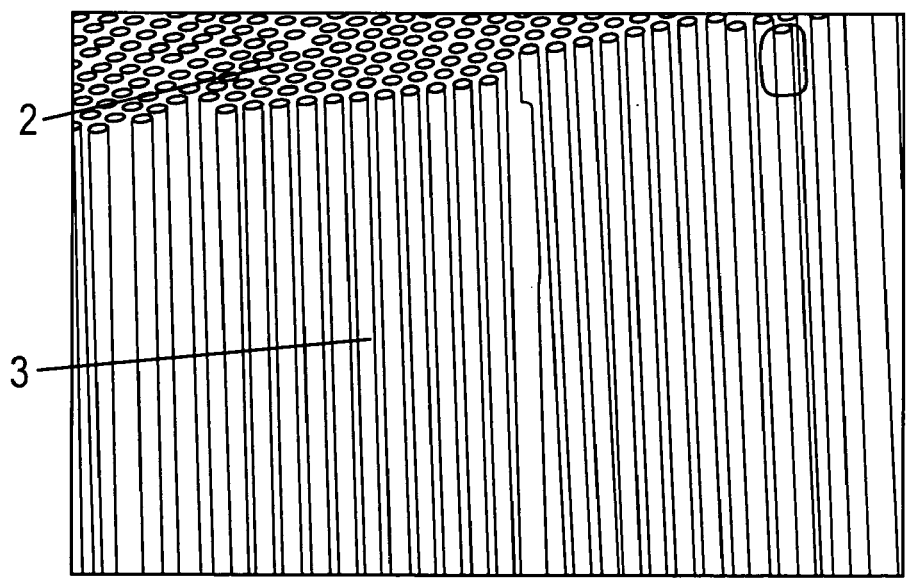

As shown in FIG. 11d, with first set of trenches 5 having been patterned to expose a first distal end of lateral nanopores 7 in lateral AAO material 6, the process may include using precursor molecules 9 for atomic layer deposition to deposit first material 10 into the open distal end of each nanopore 7, whereby first material 10 fills the first distal end of lateral nanopore 7, gradiently decreasing towards a second, opposite distal end of the lateral nanopore 7 along inner walls of the lateral nanopore 7. In FIG. 11e, the process may include applying photoresist or other blocking layers 11 and patterning to fill first trenches 5 to protect the first distal end of each nanopore 7. This patterned layer can be used additionally to define regions 12 for removing materials to expose the second, opposite distal end of each nanopore 7. In FIG. 1 if, the process may include using the photoresist or blocking layer II in an etching process to remove portions of upper passivation dielectric layer 4, aluminum layer 8, and AAO material 6, thereby exposing the second distal end of each nanopore 7 in a second set of trenches 14.

In FIG. 11g, the process can include a second deposition of materials 15 to introduce a second material 16 into the second distal end of each nanopore 7 within AAO material 6. Second material 16 is deposited into the second, opposite distal end of each nanopore 7, gradiently decreasing towards the first distal end within first material 10. This occurs primarily at the nanopore end opposite the first distal end, as illustrated in FIG. 11d. Accordingly, first material 10 and the second material 16 can be concentrically disposed within each nanopore 7. In certain embodiments of the present invention, the first and second materials 10, 16 each include specific material types to create a specific lateral two-terminal nanopore device, such as a solar cell, diode, capacitor, battery, or a supercapacitor. In FIG. 11h, the process can include removing photoresist layer 11, yielding first and second set of trenches 5, 14 that provide physical and electrical access to distal ends of each nanopore 7 filled with first and second materials 10, 16, spatially disposed near distal ends of each nanopore 7. Finally, in FIG. 11i, the process can include filling first and second trenches 5, 14 with metal to form contacts and wiring 17, 18. Wiring 17 contacts first material 10 on both sides and along the row of first distal ends of each nanopore 7, while wiring 18 contacts second material 16 on both sides and along the row of second distal ends of each nanopore 7.

This process sequence can result in lateral two-terminal nanopore or nanotube devices wired in alternating parallel rows. One of ordinary skill in the art would recognize that a number of modifications can be made to this process. For example, after removing photoresist layer 11 in FIG. 11g, it can be beneficial to replace photoresist layer 11 by a photoresist layer having wider trench dimensions, so that the etching process will remove any sidewall deposits before construction of contacts and wiring. A number of steps are needed to produce the final contacts and wiring, with several options for the sequence needed. Either the first or second material 10, 16 can be replaced with two or more materials to achieve different device behavior and performance. For example different materials can be used to create a solar cell device, as illustrated in FIG. 7, and different materials can be used to create a capacitor device, as illustrated in FIG. 8.

While high conformality and control of ALD makes it attractive for forming first and second materials 10, 16 in the AAO nanopores, other processes, such as ECD, CVD, and sol-gel processes can be useful for some of the process steps to introduce materials into the nanopores 7. As another example, there may be advantages to opening both sets of trenches 5, 14 before alternately blocking one end and depositing in the other end of the nanopores for each material.

The choice of materials and deposition processes can depend significantly on the device type to be created. For the lateral two-terminal nanotube solar cell device, as shown in FIG. 7, ALD is a preferred deposition process for introducing first material 4 in order to achieve uniform deposition within the nanopore and further to assure that first material 4 terminates before it reaches the other distal end of the nanopore, thereby defining a first material 4 contact at only one distal end of the lateral two-terminal nanotube solar cell device. In FIG. 7, the profile of n-type semiconductor material 4 is most suitable for using ALD to deposit first material 4. In contrast, ALD or possibly electrochemical vapor deposition (ECD), chemical vapor deposition (CVD), or sol-gel processes can be considered for second material 5, the p-type semiconductor material, because deep filling is needed for second material 5, but with less demand on profile control. Profiles of the two materials, as shown schematically in FIGS. 7a, 7b, and 7c, indicate a long interface along the nanopore where depletion region 8 exists. The existence of a long depletion region 8 provides a major benefit for efficient solar energy capture and charge separation, whereby the length of the depletion region 8 is preferably at least 25% of the length of AAO material 6.

One of ordinary skill in the art will recognize various alternatives to this embodiment. Various electron donor and acceptor materials can be chosen for the first and second semiconductor materials. Either donor or acceptor material, or n-type or p-type semiconductor material, can be chosen as the first material, to be deposited by ALD as a first material in a first distal end of each nanopore. Semiconducting materials can be, for example, zinc oxide (ZnO) (either n-type or p-type), titanium oxide ($TiO_2$) (n-type), copper oxide-nickel oxide ($Cu_2O$—NiO) (p-type).

While FIG. 7 illustrates only a single material available for electrical contact at each distal end of a lateral two-terminal nanotube device, this limitation may not be essential. For example, if the material profiles produce two materials in contact with wiring at a distal end of the lateral two-terminal nanotube device, the work function of electrical metal contacts 6 or 7, as illustrated in FIG. 7c, can produce Schottky barriers that are essentially ohmic to one material and blocking contacts to the other material, essentially circumventing the need to fabricate lateral two-terminal nanotube devices with only one material at each distal end.

For the lateral two-terminal nanotube capacitor device illustrated in FIG. 8, first and second materials 4, 5, which are contacted at the distal ends by electrical contacts 6, 7 of the lateral two-terminal nanotube, can function as two conducting electrodes in an energy storage capacitor, separated by a thin dielectric layer 8 to insulate them from each other. Thus, at least one additional material can be deposited or grown in the nanopores. According to certain embodiments of the present invention, ALD is used for its ability to control the thickness of very thin layers even in very high aspect ratio structures. Furthermore, high dielectric constant (high-K) dielectric materials, such as $HfO_2$, $ZrO_2$, are amenable to ALD processes, offering higher capacitance density. Since the two conducting electrodes can be electrical contacts at opposite ends of the lateral two-terminal nanotube device, it is important to achieve material profiles that ensure that only one of the conducting materials is present at the electrical contact regions at the distal ends of each nanopore. This further supports the use of ALD to achieve controlled termination of first material 4 deep in the nanopore from the first distal end, but not penetrating to the second distal end. A modified ALD process, CVD, ECD, or sol-gel process can be used to close the nanopore at the first end, thereby assuring that electrical contact 7 at the first distal end can only be made of first material 4.

Dielectric layer 8 is preferably introduced from the second distal end using ALD, though other methods can also be used. Thermal oxidation is another option, though typically this involves considerably higher temperatures and other effects compared with the low temperatures requirements of ALD. The second material 5 of the inner electrode having a conducting material can then be introduced at the second distal end by ALD, ECD, CVD, sol-gel process, or other similar process.

Materials for the outer electrode of first material 4 and the inner electrode of second material 5 can be electrically conducting so that they can transport charge to and from their surfaces, storing it particularly at their interfaces with the dielectric layer 8 to achieve high power and energy density. Materials for the electrodes can include metals such as aluminum (Al), copper (Cu), tungsten (W), binary compounds, such as titanium nickel (TiN) or tungsten nickel (WN), or more complex materials, such as indium tin oxide (ITO). The materials for the outer electrode of first material 4 and the inner electrode of second material 5 may be different or the same. The material dielectric layer 8 can be aluminum oxide ($Al_2O_3$) or a high-K dielectric, silicon dioxide ($SiO_2$), or other insulating materials. For the dielectric layer 8, the material preferably has properties including high conformality, low leakage current, high breakdown field, and high dielectric constant.

While the above description relates specifically to conducting electrodes that store charge at their surfaces, it is noted that other materials may be employed to create lateral two-terminal nanotube devices that function as electrochemical supercapacitors. Electrochemical supercapacitors store charge within the electrode materials, for example, manganese oxide ($MnO_2$), and at their surfaces, employing electrolytes as the dielectric layer 8, for example, solid electrolytes).

It is noted that the final structure depicted in FIG. 11i is a complete layer of lateral two terminal nanotube devices that can serve either for energy capture or energy storage. The sequence of steps in FIGS. 11a-11i can then be repeated to form a second active layer of lateral two-terminal nanotube devices on top of the first with electrical contacts for the device layers appropriately connected to achieve integrated energy systems as illustrated in FIG. 10. Thin film transistor circuitry can also be fabricated compatible with the processes and sequences described for certain embodiments of the present invention, enabling management of power between different lateral two-terminal nanotube device layers or including other types of thin film devices. Optimization of such energy systems may also include distributing different lateral two-terminal nanotube device hierarchies at different locations on a spatially extended substrate, such as a flat panel.

It is to be understood that in the embodiment of the present invention, the steps are performed in the sequence and manner as shown although the order of some steps and the like can be changed without departing from the spirit and scope of the present invention. In addition, the process sequence described in FIGS. 11a-11i can be repeated as many times as needed. Variations of the process sequence described in FIGS. 11a-11i can also use different materials and processes.

The many features of the invention are apparent from the detailed specification and, thus, it is intended by the appended claims to cover all such features of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents can be resorted to, falling within the scope of the invention.

We claim:

1. A lateral nanotube device, comprising:
   a substrate;
   an anodic oxide material disposed on the substrate;
   a column disposed in the anodic oxide material, wherein a length of the column is parallel to the substrate, extending from one distal end of the anodic oxide material to another end of the anodic oxide material;
   a first material disposed within the column; and
   a second material disposed within the column,
   wherein the first material fills a distal end of the column and gradiently decreases towards another distal end of the column along inner walls of the column, and
   wherein the second material fills the another distal end of the column and gradiently decreases towards the distal end of the column within the first material.

2. The lateral nanotube device of claim 1, wherein the first material is exposed at the distal end of the column, and wherein the second material is exposed at the another distal end of the column.

3. The lateral nanotube device of claim 1, wherein the first material and the second material are concentrically disposed within the column.

4. The lateral nanotube device of claim 1, wherein one of the first material and the second material comprises an electron donating material, and wherein the other of the first material and the second material comprises an electron accepting material.

5. The lateral nanotube device of claim 1, wherein the first material and the second material overlap at least 25% of a length of the column.

6. The lateral nanotube device of claim 1, further comprising:
   a first wiring structure operatively connected to an exposed end of the first material; and
   a second wiring structure operatively connected to an exposed end of the second material.

7. The lateral nanotube device of claim 1, wherein the column comprises at least one of a diameter, a width, or a thickness in a range of 5-3000 nm.

8. The lateral nanotube device of claim 1, wherein the anodic oxide material is selected from the group consisting of aluminum oxide, titanium oxide, silicon, or a dielectric material.

9. The lateral nanotube device of claim 1, wherein the lateral nanotube device comprises one of a solar cell, a light emitting diode, or a laser.

10. The lateral nanotube device of claim 1, wherein the lateral nanotube device comprises a diode.

11. The lateral nanotube device of claim 1, wherein the substrate is rigid or flexible.

12. The lateral nanotube device of claim 1, further comprising:

a conductive layer disposed on an outer surface of the first material.

13. The lateral nanotube device of claim 1, further comprising:
a conductive layer disposed within the second material.

14. The lateral nanotube device of claim 1, further comprising:
a first conductive layer disposed on an outer surface of the first material; and
a second conductive layer disposed within the second material.

15. The lateral nanotube device of claim 14, wherein the first conductive layer and the second conductive layer each comprise a material selected from the group consisting of a metal, wherein the metal comprises at least one of aluminum, copper, titanium, or a conducting compound, wherein the conducting compound comprises indium-tin-oxide.

16. The lateral nanotube device of claim 1, wherein one of the first material and the second material comprises an n-type semiconductor material, and wherein the other of the first material and the second material comprises a p-type semiconductor material.

17. The lateral nanotube device of claim 1, wherein the anodic oxide material comprises a rectangular patterned area disposed on the substrate.

18. The lateral nanotube device of claim 1, wherein a thickness of the anodic oxide material is in a range of 25 nm to 1 millimeter.

19. A lateral nanotube device, comprising:
a substrate;
an anodic oxide material disposed on the substrate;
a plurality of columns, each column disposed in the anodic oxide material wherein a length of the columns is parallel to the substrate, extending from a distal end of the anodic oxide material to another distal end of the anodic oxide material;
a first material disposed within each column; and
a second material disposed within each column,
wherein the first material fills a distal end of each column and gradiently decreases towards another distal end of each column along inner walls of each column, and
wherein the second material fills the another distal end of each column and gradiently decreases towards the distal end of each column within the first material.

20. A lateral nanotube device, comprising:
a substrate;
an anodic oxide material disposed on the substrate;
a column disposed in the anodic oxide material, wherein a length of the column is parallel to the substrate, extending from one distal end of the anodic oxide material to another end of the anodic oxide material;
a first material disposed within the column;
a second material disposed within the column; and
a third material disposed between the first material and the second material,
wherein the first material fills a distal end of the column and gradiently decreases towards another distal end of the column along inner walls of the column, and
wherein the second material fills the another distal end of the column and gradiently decreases towards the distal end of the column within the first material.

21. The lateral nanotube device of claim 20, wherein the third material comprises an electrical insulator.

22. The lateral nanotube device of claim 20, wherein the lateral nanotube device comprises an electrostatic capacitor.

23. The lateral nanotube device of claim 20, wherein the lateral nanotube device comprises one of an electrostatic capacitor, a battery, or a supercapacitor.

24. The lateral nanotube device of claim 20, wherein the first material and the second material are electrically conducting.

25. A system, comprising:
a plurality of lateral nanotube devices configured one on top of each other,
wherein each lateral nanotube device comprises:
a substrate;
an anodic oxide material disposed on the substrate;
a column disposed in the anodic oxide material, wherein a length of the column is parallel to the substrate, extending from one distal end of the anodic oxide material to another end of the anodic oxide material;
a first material disposed within the column; and
a second material disposed within the column;
wherein the first material fills a distal end of the column and gradiently decreases towards another distal end of the column along inner walls of the column, and
wherein the second material fills the another distal end of the column and gradiently decreases towards the distal end of the column within the first material.

26. A system, comprising:
a plurality of lateral nanotube devices configured one on top of each other,
wherein each lateral nanotube device comprises:
a substrate;
an anodic oxide material disposed on the substrate;
a column disposed in the anodic oxide material, wherein a length of the column is parallel to the substrate, extending from one distal end of the anodic oxide material to another end of the anodic oxide material;
a first material disposed within the column;
a second material disposed within the column; and
a third material disposed between the first material and the second material,
wherein the first material fills a distal end of the column and gradiently decreases towards another distal end of the column along inner walls of the column, and
wherein the second material fills the another distal end of the column and gradiently decreases towards the distal end of the column within the first material.

27. The system of claim 25, wherein the plurality of lateral nanotube devices are wired in parallel.

28. The system of claim 25, wherein at least two of the lateral nanotube devices comprises a different material set for the second material and the third material within the column.

* * * * *